United States Patent [19]
Malarsie

[11] Patent Number: 5,892,717
[45] Date of Patent: Apr. 6, 1999

[54] CLAMP FOR DIFFERENTIAL DRIVERS

[75] Inventor: Louis J. Malarsie, Steep Falls, Me.

[73] Assignee: Fairchild Semiconductor Corporation, So. Portland, Me.

[21] Appl. No.: 15,456

[22] Filed: Jan. 29, 1998

[51] Int. Cl.$^6$ .................................................. G11C 7/00
[52] U.S. Cl. ..................... 365/189.06; 365/190; 365/175
[58] Field of Search ................ 365/189.06, 190, 365/175; 327/325, 379; 340/310.01, 310.02, 310.03, 310.06

[56] References Cited

U.S. PATENT DOCUMENTS

| | | |
|---|---|---|
| 4,654,549 | 3/1987 | Hannington . |
| 4,675,551 | 6/1987 | Stevenson et al. . |
| 4,771,191 | 9/1988 | Estrada . |
| 5,239,559 | 8/1993 | Brach et al. . |
| 5,589,813 | 12/1996 | Nielsen . |
| 5,714,900 | 2/1998 | Ehlers .................................. 327/325 |

*Primary Examiner*—Vu A. Le
*Attorney, Agent, or Firm*—Pierce Atwood; Chris A. Caseiro

[57] ABSTRACT

A digital-data-transmission-line circuit for actively clamping transmission signal and signal-complement amplitudes so as to reduce pattern-related jitter at a receiver/analyzer. The circuit includes a pair of opposing diode devices, where each diode device is coupled across the pair of conducting wires that make up the transmission line. The diode devices clamp the difference in potential between the two transmission lines so that the signal amplitude seen at the receiver will not vary to significantly with the number of like pulses that are transmitted in succession. In this manner, the present invention reduces pattern-dependent jitter in the cross-over from HIGH to LOW as seen at the receiver. By means of the parasitic capacitance accompanying the diode devices, the circuit of the present invention additionally provides some high-frequency filtering and smoothing of the waveform of the received signal.

12 Claims, 1 Drawing Sheet

CLAMP FOR DIFFERENTIAL DRIVERS

BACKGROUND OF THE INVENTION

1. Field of the Invention

The present invention relates to clamping differential drivers. More particularly, the present invention relates to the field of digital data transmission. More particularly yet, the present invention relates to improving the consistency of digital data transmissions over long cables and especially to reducing pattern-dependent jitter when such cables are used. Still more particularly, the present invention is a clamping circuit for reducing pattern-dependent jitter in digital data transmission/reception by means of amplitude clamping and also for high-frequency filtering in such transmission/reception.

2. Description of the Prior Art

Digital data is typically transmitted between electronic devices such as telephones, facsimile machines, computers, and the like, by simple electric cables. Such a cable can be as simple as a pair of twisted wires, the impedance of which is about 50–100 ohms, an acceptable and accounted-for impedance. However, when such cables are used to transmit data over great distances (which can be defined as distances in excess of 30 meters) and/or when the rate of data transmission becomes high, the cable itself becomes an important component of the overall system, in that its increasing resistance can result in data errors being introduced at the receiving end of the cable, related to an increase in the ramping of bit patterns.

For present purposes, it is sufficient to think of the transmission cable as a single pair of wires connected to a transmitter which at any instant is imposing on one member of the pair a signal and on the other member of the pair a signal-complement. The signal is binary and at any time one wire will have imposed on it by the transmitter either a HIGH signal or a LOW signal, while the complement of that signal is imposed on the other member of the pair. Of course, either wire can conduct either signal. The two wires are typically connected to a differential receiver for subsequent processing.

Under ideal transmission/reception conditions, the signals imposed at the transmission end of the line will be exactly reproduced at the receiver. This will be achieved if the rise-time and fall-time (for LOW-to-HIGH and HIGH-to-LOW transitions, respectively) of the voltage on the cable is extremely well defined and consistent. Although this is physically impossible, given that the cable is a real physical entity with its own characteristic impedance leading to finite rise- and fall-times, it is sufficient as a practical matter that these times be short with respect to the duration of the individual pulses making up the digital signal.

As transmission lines become longer—with a concomitant increase in their rise—time-and signal rates higher—with a concomitant decrease in pulse-width—it becomes increasingly more challenging to ensure that the signal seen at the receiver bears a unique correlation to the signal imposed at the transmitter end of the cable. Although it is not necessary that there be exact identity between these two signals, it is necessary that the correlation does not depend on things such as a particular pattern of HIGHs and LOWs transmitted.

For definiteness, this discussion will address most transmission systems, with varying definitions of what constitutes HIGH and LOW, respectively. In particular, it will be directed to systems in which a "high" voltage level is identified generically as VOH, while a "low", voltage level is identified generically as VOL. The particular voltage levels and swings associated with VOH and VOL depend upon the particular transmission/reception circuitry associated with the transmissions. For example, in emitter coupled logic (ECL) systems and low voltage differential systems (LVDS), the swings between VOH and VOL are relatively small—on the order of 700 mV for example. On the other hand, for transistor-transistor logic (TTL) systems, the swings between VOH and VOL may be much greater—on the order of 2 V or more.

In order to have a reproducible transmission of data, there must be a correlation between the HIGH/LOW or LOW/HIGH "cross-over", at the transmitter and the cross-over at the receiver. If that correspondence is not achieved, an incoming signal may not be translated properly and bits of information may be lost for failure to be read properly. Although the respective cross-overs at the two ends of the cable will not occur at precisely the same instant, it is important to ensure that any delay that exists remains constant and, in particular, not dependent on the pattern of HIGHs and LOWs imposed by the transmitter.

FIG. 1 depicts a simplified transmission/reception system in accord with the above discussion. It shows an incoming signal 5 giving rise at the input driver 6 to itself and to its complement prior to being imposed on the transmitter-ends of a signal line 8 and a signal-complement line 9, the receiver ends of which are connected to an input driver or translator 7, generally a differential driver. By this circuit arrangement, HIGH/LOW signal strings representing digitized information—such as voices, music, pictures, etc.—are delivered from one location to another. It is the transmission fidelity of these strings that is of interest here. The particular problem addressed is data loss arising from transition time jitter which in turn is due to HIGH-to-LOW transition-interval variation based on signal string pattern.

If the charge time of the transmission line is significant with respect to the pulse-width of the signal imposed on the line by the transmitter, then the amplitude of the HIGH pulse seen by the receiver will vary with signal pattern. To see this, consider first that the signal imposed by the transmitter consists of a simple string of pulses 01010101010101—the highest transmission frequency possible. When the rise time of the transmission line is greater than the pulse width, the voltage seen by the receiver during a single HIGH pulse will not reach the maximum VOH; indeed, the voltage at the receiver will still be rising when the HIGH-to-LOW transition is imposed. In the extreme case, the transmission cable may load down the transmitter so much that the voltage seen at the receiver may never reach an unambiguous HIGH level associated with the particular VOH of the particular transmission/reception system. This is not the situation being addressed here, but rather the situation where the voltage at the receiver reaches some level higher than a minimal VOH but lower than an ideal VOH during a time interval of one pulse-width. Thus, even though the voltage at the receiver does not reach the level imposed by the transmitter, it will be high enough to cause a LOW-to-HIGH transition at the receiver end. It can be seen that, up to a point, the more HIGH pulses are transmitted in succession the higher the voltage will reach at the receiver. This per se will not cause a problem, since anything above the minimal VOH will be read as HIGH. The problem comes from the fact that the higher the transmission-cable voltage is when a HIGH-to-LOW is imposed, the longer it will take for the voltage on the transmission line to fall to the cross-over voltage, that is, to the voltage where the receiver will make the transition to LOW. Thus, for example, the mid-string HIGH-to-LOW transition at the receiver will occur at a different time for the string 11110000 than it will for the string 01010000. Since generally the systems will be driven by an internal system clock, this means that, depending on the particular nature of the signal string being transmitted, the instant at which a particular HIGH-to-LOW transition occurs will deviate from the clock transition time by an amount depending on the preceding signal string. This shifting back and forth about the clock period is referred to as pattern-dependent jitter, something that may result in an indeterminant signal level, resulting in the dropping of a bit. While loss of a single bit is of minimal concern, it is undesirable to have unnecessarily high bit error rates in transmissions.

As far as is known, there is no prior art relating to the reduction of the pattern-dependent jitter described above. As is discussed below, the approach of the present invention to this reduction involves a diode-based clamping of the receiver-input voltage. In the general field of using diodes to clip amplifier input, for example for protection against electrostatic spikes, there is of course prior art. For example, U.S. Pat. No. 5,589,813 issued to Nielsen in 1996, describes the use of a pair of diodes essentially as electrostatic discharge (ESD) protection devices in a communications system. Nielsen thus provides a pathway for voltage transients that may or may not ever occur. This contrasts greatly with the use of diodes to address pattern-dependent jitter on transmission lines that otherwise would occur on a fairly regular basis. Moreover, Nielsen includes a capacitor in series with the diodes, which capacitor will cause an opening of the circuit including the diode pathways after there is a transition between HIGH and LOW signals, thus preventing further signal transfer through the open pathway.

What is needed is a circuit that actively clamps excess amplitude voltage signals particularly evident of pattern-dependent jitter. That is, what is needed is a circuit that limits the relative maximum amplitude between the complementary signals delivered by the differential pair of transmission lines. What is also needed is such a circuit that remains operative during signal transitions and during fixed patterns of either HIGH or LOW transmissions. Further, it is also preferred to have a circuit that provides some beneficial high-frequency filtering in addition to clamping. Still further, what is needed is such circuitry that is readily compatible with existing differential drivers and that is relatively simple to manufacture.

SUMMARY OF THE INVENTION

It is an object of the present invention to reduce pattern-dependent jitter at the receiver end of a digital-data transmission line. In that regard, it is an object of the present invention to provide a circuit that limits the relative maximum amplitude between the complementary signals delivered by the differential pair of transmission lines. It is a further object of the present invention to achieve such reduction with a simple circuit suitable for retrofitting existing devices as well as being included with high frequency digital data receivers. It is also a supplemental object of the present invention to provide such a circuit that also provides some high-frequency filtering in addition to pattern-dependent jitter reduction.

These and other objectives are achieved in the present invention through the introduction of simple diode-based sub-circuitry coupleable to existing differential drivers of the type commonly used in the reception and conversion of transmitted digital data. Its application is aimed in particular at transmission set-ups involving relatively long distances. In its most basic form, the sub-circuitry of the present invention includes a pair of opposed diodes in a circuit which when interposed into the transmission line will result in both diodes being connected across the two wires making up a transmission line pair. Preferably but not necessarily, this interposition takes place between the receiver end of the transmission line and the input to the receiver itself, proximate to the input driver. In addition to so introducing it to the transmission circuit, It may be fabricated as an integral part of the receiver input driver. The standard I-V characteristics of common diodes are sufficient to serve the purposes of the present invention. In other words, for the purposes of the present invention, it is necessary to have a device that blocks—i.e., does not conduct current—for all anticipated voltages in one direction (the diode's reverse direction) and conducts for all voltages in the other direction (the diode's forward direction) above a certain threshold voltage $V_T$. This clamps the voltages on each transmission line pair, such that the voltage in one line is never more than $V_T$ above the other line. The two diode devices work in concert, one or the other of them always being "active", in the sense that it is clamping the HIGH signal in the wire that is attached to its anode end. During that same period, the other diode will be non-conducting. The difference in amplitude of signal between the differential transmission pair is selectable as a function of the design of the diode devices.

Although best visualized in terms of being single diodes, the diode devices of the present invention may be any sort of device having a threshold potential having the I-V characteristics described above. In addition to simple diodes, other semiconductor devices, including but not limited to diode-wired transistors, and multiple diodes wired in series or parallel may be employed. In operation, the diode device of a particular transmission line is activated when its conducting threshold voltage is reached. For the most part, that will occur in a manner that forward-biases the diode device needed to clamp the amplitude swing between the transmission pair. Therefore, since one or the other of the transmission lines of a pair of connectors or a twisted wire pair will be at a HIGH potential, one of the two anti-parallel diode devices will always be operative, while the other will not be operative. The clamping circuit of the present invention is therefore substantially always active as a function of the particular signal string.

The diode devices may be tailored to provide clamping at a potential suitable for the particular transmission system of which it is a part. Ultimately, it is the turn-on threshold of the particular diode device that defines the extent of the clamping. It is contemplated that the threshold may be as low as 400 mV, and may be designed to be much greater than that as a function of the particular transmission system. In that regard, one or more diodes may be stacked together on one or the other or both of the diode devices connected across the transmission line pair. One approach that may be used to determine the selected clamping potential is to fix that value in accordance with the maximum amplitude of the highest frequency of the pattern, e.g., 0101010101 . . . where there is little time for the potential swing to become unacceptably wide.

In summary, the present invention reduces pattern-dependent jitter by fixing the amplitude differential between the potentials of the transmission line pair. A corresponding benefit of the simple circuit of the present invention is that there is a capacitance associated with the diode devices that will serve to shunt high frequency noise so that it does not appear at the receiver input. In this manner, it is a filter of fairly mild (small stray capacitances on the order of a few pF) high frequency noise.

It is to be understood that other objects and advantages of the present invention will be made apparent by the following description of the drawings according to the present invention.

DETAILED DESCRIPTION OF THE PREFERRED EMBODIMENT

Figure 1:
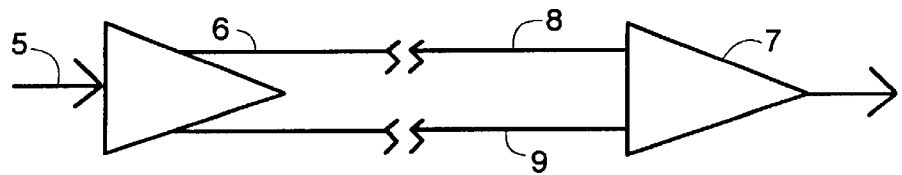
FIG. 1 is a simplified diagrammatic illustration of a prior art transmission circuit with an output driver, a transmission line pair, and an input driver.
Figure 2:
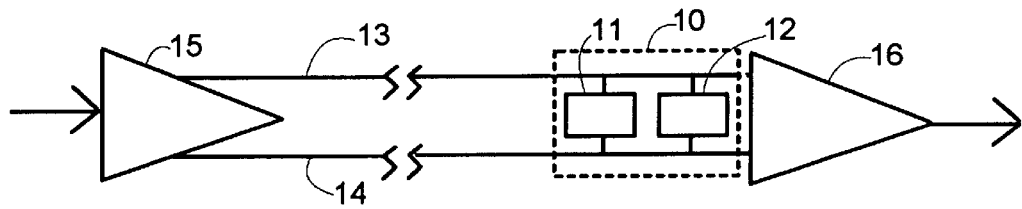
FIG. 2 is a simplified diagrammatic illustration of the clamping circuit of the present invention shown coupled with an output driver, a transmission line pair, and an input driver.

As illustrated in FIG. 2, a driver clamp 10 of the present invention includes a parallel pair of opposing diode devices 11 and 12. The diode devices 11 and 12 are anti-parallel and connected between two complementary transmission lines 13 and 14 leading from a transmission output driver 15 and to a receiver 16. The complementary transmission lines 13 and 14 may be any sort of differential or twisted pair of connectors designed to deliver electrical signals from one location to another. It is to be noted that the driver clamp 10 may be used with any type of differential driver, including, but not limited to, any type of converter, such as an ECL-to-TTL, ECL-to-CMOS, or fan-out buffer. The clamp 10 is intended to be an active means for clipping the potentials associated with the signals carried by lines 13 and 14 to receiver 16 so that the amplitude differential between the complementary signals remains well defined. In the context of the present invention, "active" ,means that the driver clamp 10 is operative under most transmission conditions.

In operation, when transmission line 13 is carrying a series of HIGH potential signals, and transmission line 14 is carrying a complementary series of LOW potential signals, diode device 12 is designed to clamp the HIGH signal to the threshold turn-on of diode device 12, in that its anode is coupled to line 13. Under these conditions, diode device 11 is essentially off. Of course, the roles of diode devices 11 and 12 are reversed when there is a transition between HIGH and LOW of the output signals on transmission lines 13 and 14. The effect of diode devices 11 and 12 is to ensure that the amplitude of the signal associated with the transmission lines 13 and 14 do not swing too greatly beyond a desired amplitude differential during a series of continuous signals of the same potential, e.g., 0000011111, as opposed to a signal series such as 0101010101. As earlier noted, the maximum amplitude swing associated with that highest frequency 0101010101 pattern may be used as the bench mark for setting the clamping potential associated with the driver clamp 10

Figure 3:
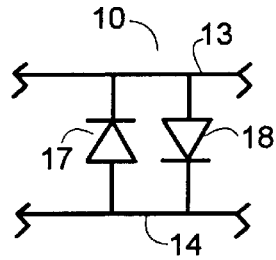
FIG. 3 is a simplified diagram of the clamping circuit of the present invention as being formed of a pair of anti-parallel diodes.

In the preferred embodiment of the clamp 10, the diode devices 11 and 12 are simply a first diode 17 and a second diode 18 that is anti-parallel to (opposed to) diode 17, as shown in FIG. 3. The diodes 17 and 18 may be selected to provide clamping at a desired potential. For example, diodes 17 and 18 may simply be p-n junction devices with threshold turn-on potentials at or about 400 mV, such as for use in a LVDS, or they may have thresholds of about 700 mV, such as for use in an ECL system. Both diodes 17 and 18 may have the same threshold characteristics, or they may be chosen to be different, as the required clamping conditions change.

Figure 4:
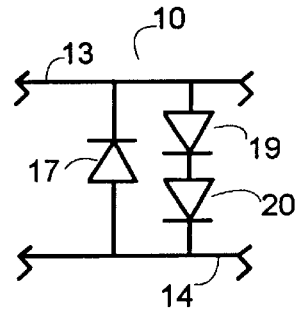
FIG. 4 is a simplified diagram of an alternative design of the clamping circuit of the present invention including stacked diodes as part of the clamping circuit.

The diode devices 11 and 12 shown in FIG. 2 may each include more than one of the diodes 17 or 18, as illustrated in FIG. 4, wherein diode device 11 includes first diode 17, while diode device 12 includes a pair of diodes 19 and 20. Each component of each of the diode devices 11 and 12 may be equivalent, or there may be a mixing of individual components so as to make the overall characteristics of the clamp 10 fit any desired value. For example, diode 19 may have a threshold turn-on potential of about 700 mV, while diode 20 may have a threshold of only 400 mV. An advantage of the clamp 10 of the present invention is that this active selective clamping may be achieved by fabricating diode devices 11 and 12 with desired characteristics in a manner well known to those involved in fabricating semiconductor devices. It can be seen then that the clamp 10 may be designed to accommodate most any fixing of amplitude differential desired-preferably, although not essentially, the maximum amplitude associated with the highest-frequency pattern. Of course, tailoring of the clamping may be associated with other system parameters. Regardless of the particular clamping values selected, it is to be noted that the diode devices 11 and 12 may be part of a discrete system or they may be formed as part of output driver 15 or receiver 16.

Figure 5:
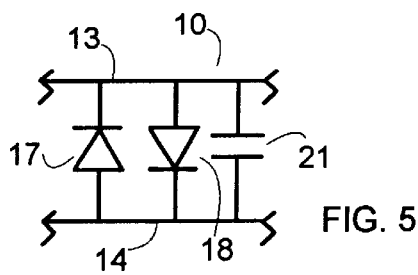
FIG. 5 is a simplified diagram of the effective design of the clamping circuit of the present invention, showing the parasitic capacitance associated with the clamping diodes.

As illustrated in FIG. 5, the clamp 10 includes a parasitic capacitance 21 associated with the equivalent capacitance of the diode devices 11 and 12. The capacitance 21 shown in FIG. 5 is purely representational in that there is no specific capacitor required as part of the clamp 10. Capacitance 21 cannot be avoided when semiconductor devices are involved and, in any event, in this application it provides the added benefit of some high-frequency filtering. That is, capacitance 21, which may be on the order of about 5–20 pF for the diode devices 11 and 12 contemplated for clamping typical transmission potentials, blocks the transmission of spurious signals that exceed the signal frequency that the transmission system is rated for. It is to be noted that resistances may be added to the circuit lines including diode devices 11 and 12 as a way to "shape" ,the transition from either HIGH to LOW or LOW to HIGH in a manner well known to those skilled in the art.

Figure 6:
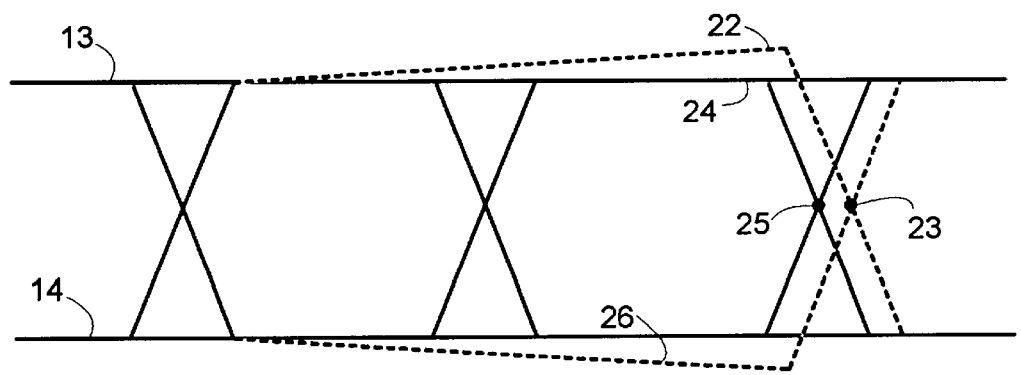
FIG. 6 is an illustration of the effect of the clamping circuit on the signal supplied over a transmission line pair from an output driver to a receiver.

FIG. 6 illustrates the problem of pattern-dependent jitter and its solution by the addition of clamp 10 to the circuitry including output driver 15 and receiver 16 and transmission lines 13 and 14. As shown in a simplified example of the problem associated with the jitter, a first HIGH potential amplitude 22 resulting from transmission of a series of three HIGH signals across an unclamped transmission line yields at the time of a transition from HIGH to LOW an undesired cross-over point at 23. Depending upon the time associated with reaching the undesired cross-over point at 23, bits of information being delivered from driver 15 to receiver 16, may well be lost. Through the addition of clamp 10 to the transmission system, a second HIGH potential amplitude 24 is maintained regardless of the number of like potentials transmitted in series. By maintaining the second HIGH potential amplitude 24 at a constant value, the desired expected cross-over point at 25 is reached. Correspondingly, a first LOW potential amplitude 26 that is the complement of first HIGH potential amplitude 22 must otherwise overcome the charge build-up associated with the HIGH potential line in the transition from VOL to VOH.

It should be understood that the preferred embodiments mentioned here are merely illustrative of the present invention. Numerous variations and equivalents in design and use of the present invention may be contemplated in view of the following claims without straying from the intended scope and field of the invention herein disclosed.

I claim:

1. A circuit for actively clamping the potential of a digital signal and its complement transmitted from a transmitter through a first transmission line and a second transmission line to a differential driver in order to minimize pattern-dependent jitter, wherein the first transmission line and the second transmission line are in parallel, the circuit comprising:

a. a first diode device having an anode coupleable to the first transmission line and a cathode coupleable to the second transmission line; and b. a second diode device having an anode coupleable to the second transmission line and a cathode coupleable to the first transmission line.

2. The circuit as claimed in claim 1 wherein said first diode device includes a first diode and said second diode device includes a second diode in series with a third diode.

3. The circuit as claimed in claim 2 wherein said first diode, said second diode, and said third diode each has a threshold turn-on potential of about 700 mV.

4. The circuit as claimed in claim 2 wherein said first diode has a threshold turn-on potential of about 400 mV, and said second diode and said third diode each has a threshold turn-on potential of about 700 mV.

5. The circuit as claimed in claim 1 wherein said first diode device and said second diode device are each coupled to an ECL-to-TTL differential driver.

6. The circuit as claimed in claim 1 wherein said first diode device and said second diode device are each coupled to an ECL-to-CMOS differential driver.

7. A circuit for actively clamping the potential of a digital signal and its complement transmitted from a transmitter through a first transmission line and a second transmission line to a differential driver, in order to minimize pattern-dependent jitter, wherein the first transmission line and the second transmission line are in parallel, the circuit comprising:

a. a first diode device having an anode coupleable to the first transmission line and a cathode coupleable to the second transmission line; and b. a second diode device in series with a third diode device, wherein a combination of said second diode device and said third diode device has an anode coupleable to the second transmission line and a cathode coupleable to the first transmission line.

8. The circuit as claimed in claim 7 wherein said first diode device is a diode, said second diode device is a diode and said third diode device is a diode.

9. The circuit as claimed in claim 8 wherein said first diode, said second diode, and said third diode each has a threshold turn-on potential of about 700 mV.

10. The circuit as claimed in claim 8 wherein said first diode has a threshold turn-on potential of about 400 mV, and said second diode and said third diode each has a threshold turn-on potential of about 700 mV.

11. The circuit as claimed in claim 7 wherein said first diode device and said combination of said second diode device and said third diode device are coupled to an ECL-to-TTL differential driver.

12. The circuit as claimed in claim 1 wherein said first diode device and said combination of said second diode device and said third diode device are coupled to a low-voltage differential system.

* * * * *